(12) United States Patent
Xie et al.

(10) Patent No.: US 11,979,174 B1
(45) Date of Patent: May 7, 2024

(54) SYSTEMS AND METHODS FOR PROVIDING SIMULATION DATA COMPRESSION, HIGH SPEED INTERCHANGE, AND STORAGE

(71) Applicant: Ansys, Inc., Canonsburg, PA (US)

(72) Inventors: Jianhui Xie, Sewickley, PA (US); Jin Wang, Venetia, PA (US); Yong-Cheng Liu, Pittsburgh, PA (US); Jean-Daniel Beley, Caluire (FR)

(73) Assignee: Ansys, Inc., Canonsburg, PA (US)

( * ) Notice: Subject to any disclaimer, the term of this patent is extended or adjusted under 35 U.S.C. 154(b) by 0 days.

(21) Appl. No.: 17/863,461

(22) Filed: Jul. 13, 2022

(51) Int. Cl.
*H04L 12/70* (2013.01)
*H03M 7/24* (2006.01)
*H04L 41/0806* (2022.01)
*H04L 67/12* (2022.01)
*H04W 48/08* (2009.01)

(52) U.S. Cl.
CPC ............. *H03M 7/24* (2013.01); *H04L 67/12* (2013.01)

(58) Field of Classification Search
CPC ................................. H03M 7/24; H04L 67/12
USPC .......................................................... 709/201
See application file for complete search history.

(56) References Cited

U.S. PATENT DOCUMENTS

| | | | |
|---|---|---|---|
| 8,868,508 B2 | 10/2014 | Drobychev et al. | |
| 10,394,757 B2 | 8/2019 | Cheung et al. | |
| 2008/0189667 A1* | 8/2008 | Pikus | G06F 30/398 716/112 |
| 2012/0233417 A1 | 9/2012 | Kalach et al. | |
| 2013/0124589 A1* | 5/2013 | Deslandes | G06F 17/10 708/203 |
| 2014/0208068 A1* | 7/2014 | Wegener | H03M 7/3059 712/22 |
| 2020/0202053 A1* | 6/2020 | Hermann | G06F 17/13 |
| 2020/0302284 A1* | 9/2020 | Garcia Garcia | G06N 3/08 |
| 2020/0358455 A1* | 11/2020 | Nag | H03M 7/3071 |
| 2021/0303753 A1* | 9/2021 | Rogowski | H04N 19/70 |

OTHER PUBLICATIONS

Lindstrom, Peter, Isenburg, Martin; Fast and Efficient Compression of Floating-Point Data; IEEE Transactions on Visualization and Computer Graphics, 12(5); Sep.-Oct. 2006.

* cited by examiner

*Primary Examiner* — Moustafa M Meky
*Assistant Examiner* — Elizabeth Kassa
(74) *Attorney, Agent, or Firm* — Jones Day

(57) ABSTRACT

Systems and methods are provided for a processor-implemented method for compressing, storing, and transmitting simulation data. The simulation data including a set of floating point data values is received, the simulation data characterizing simulated physical properties of a physical object. A first master data value is identified from the set to cluster one or more data values from the set as a first group of data values based on a comparison between a data value of the set and the first master data value. Compressed simulation data is transmitted, where the compressed simulation data includes a floating point representation of the first master data value and integer representations of other data values of the first group of data values.

21 Claims, 10 Drawing Sheets

|   |   |   |   |
|---|---|---|---|
| | 1st Master | | |
| −5.8658e−05 | −1.3687e−04 | −5.8658e−05 | * |
| 2.6348e−06 | −1.1578e−04 | −2.9643e−16 | New group |
| −4.2172e−06 | −9.8402e−06 | −4.2172e−06 | |
| −2.8264e−05 | −9.1938e−05 | 4.1535e−16 | New group |
| 2.2425e−06 | −1.4123e−04 | −3.2070e−05 | |
| −2.3914e−05 | −1.2476e−04 | −2.2728e−06 | |
| −5.5402e−05 | −1.2927e−04 | −5.5402e−05 | |
| −5.0497e−05 | −9.8114e−05 | 3.4385e−15 | New group master |

FIG. 3

SYSTEMS AND METHODS FOR PROVIDING SIMULATION DATA COMPRESSION, HIGH SPEED INTERCHANGE, AND STORAGE

FIELD

This disclosure is related generally to physical system simulation and more particularly to efficient transmission of data associated with physical system simulation.

BACKGROUND

Simulation models frequently generate huge amounts of data. A simulation of a physical system often utilizes models that comprise millions or billions of cells (or other finite elements). Real number data values (e.g., displacement, stresses, strains, velocity, pressures, temperatures, special location) may be attributed to each of those cells, resulting in massive collections of data. Efficient simulation processing and data storage may benefit from efficient representation of that data.

SUMMARY

Systems and methods are provided for a processor-implemented method for compressing and transmitting simulation data. The simulation data including a set of floating point data values is received, the simulation data characterizing simulated physical properties of a physical object. A first master data value is identified from the set to cluster one or more data values from the set as a first group of data values based on a comparison between a data value of the set and the first master data value. Compressed simulation data is transmitted, where the compressed simulation data includes a floating point representation of the first master data value and integer representations of other data values of the first group of data values.

As another example, a system for compressing and transmitting simulation data includes a memory storing executable instructions and one or more data processors coupled to the memory. The one or more data processors execute the executable instructions to receive the simulation data including a set of floating point data values, the simulation data characterizing simulated physical properties of a physical object. A first master data value is identified from the set to cluster one or more data values from the set as a first group of data values based on a comparison between a data value of the set and the first master data value. Compressed simulation data is transmitted, where the compressed simulation data includes a floating point representation of the first master data value and integer representations of other data values of the first group of data values.

As a further example, a non-transitory computer-readable medium is encoded with instructions for commanding one or more data processors to execute steps of a method for compressing and transmitting simulation data. In the method, the simulation data including a set of floating point data values is received, the simulation data characterizing simulated physical properties of a physical object. A first master data value is identified from the set to cluster one or more data values from the set as a first group of data values based on a comparison between a data value of the set and the first master data value. Compressed simulation data is transmitted, where the compressed simulation data includes a floating point representation of the first master data value and integer representations of other data values of the first group of data values.

DESCRIPTION OF DRAWINGS

FIG. 3 is a diagram depicting a portion of an intermediate data set.

DETAILED DESCRIPTION

Simulation models frequently generate huge amounts of data. Often one module of a simulation will be in communication with other modules. For example, one module may be tasked with analyzing fluid dynamics behavior of a system, while another module may be focused on structural aspects of a system. It is common for those modules to interact such that one type of physics' effects (e.g., fluids) can be adequately modeled in one module's domain and another type (e.g., structural stress/strain analysis) in another module's domain. Simulation data is often best characterized as real number data that is stored in data types such as float and double data types. These floating point data types tend to be large, where float structures are commonly 4-bytes wide while double structures are 8-bytes wide. It may be difficult to compress such floating point data while maintaining desired data precision accuracy for engineering practice. Transmission of large numbers of these wide data structures may be expensive and type consuming.

Systems and methods as described herein provide mechanisms for efficient transmission and storage of simulation data. Those systems and methods may utilize one or more levels of compression to reduce the size of simulation data (e.g., as compared to a set of data values that is stored entirely in a real number format such as float or double data structures). This may enhance the ability to efficiently transmit and store that simulation data, which may be particularly beneficial in instances where simulations are performed using multiple modules or engines (e.g., different simulation engines for handling different types of physics), where those modules or engines may be physically executed on different computing devices (e.g., different servers, such as in a cloud environment).

Figure 1:
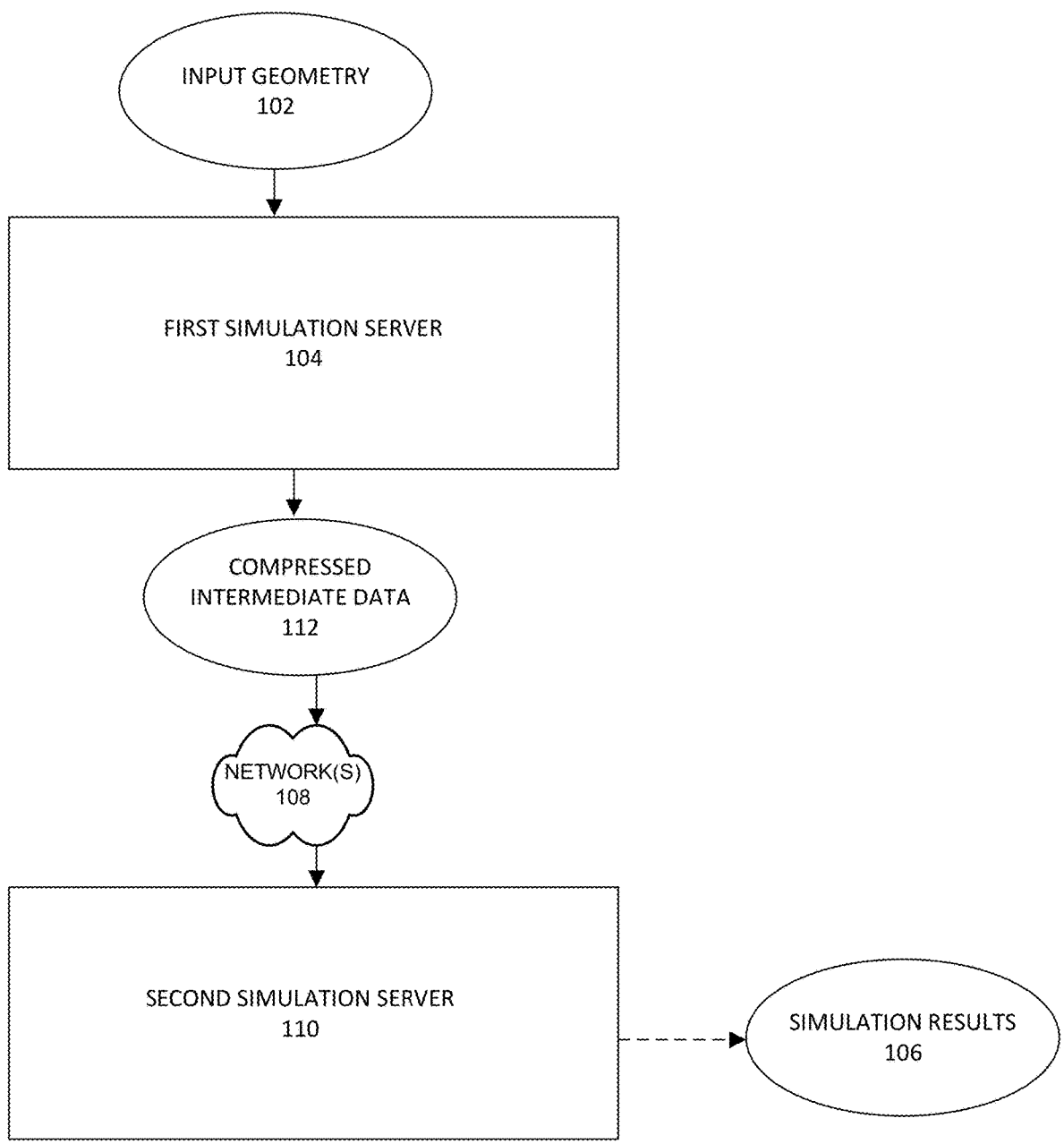
FIG. 1 is a diagram depicting a system for compressing and transmitting simulation data.

FIG. 1 is a diagram depicting a system for compressing and transmitting simulation data. A system receives input geometry 102 describing characteristics of a system to be simulated. That input geometry 102 may take the form of a mesh that includes a number of cells or other finite elements (e.g., millions, billions, or more cells) that define the boundaries and other characteristics of objects within the simulation. Simulations may be of a wide variety of types including multi-physics simulation where a simulation is performed in one or more stages. For example, a first stage may simulate the effects of one type of physics on the physical system (e.g., fluids, mechanical, electromagnetics, chemical), where a second stage uses intermediate results from the first stage to simulate effects of a second type of physics on the physical system. Additional stages providing models for simulating additional types of physics may be utilized as needed, including arrangements where feedback among the different stages is considered to model ongoing interactions among the different types of physics. In the example of FIG. 1, input geometry 102 is provided to a first simulation server 104 that includes a first simulation engine for performing part of an overall simulation process that is intended to generate simulation results 106. The first simulation server 104 performs a simulation operation on the input geometry 102 to generate input intermediate results which are compressed and otherwise packaged for transmission as compressed intermediate data 112.

In the example of FIG. 1, the compressed intermediate data 112 is transmitted from the first simulation server to a second simulation server 110 (e.g., a second server that includes a second simulation engine for providing further simulation operations based on a different type of physics than was simulated at the first simulation server 104). That transmission of compressed intermediate data 112 is over one or more networks 108. In one example, the first simulation server 104 and the second simulation server 110 are different provisioned cloud resources, which may be housed in different computing environments (e.g., in different locations, which may be in a common data center or disparate data centers separated by long distances). In one embodiment, the provisioned servers 104, 110 are general purpose computing resources, while in other instances the provisioned servers are specially configured to handle physics associated with the simulation engines running thereon. In other examples, the first simulation server 104 and the second simulation server 110 may be part of a common computing system which may be running on a single computing entity (e.g., separate virtual machines, services, processes, or threads operating on a common server).

The second simulation server 110 may in some instances output final simulation results 106 that may be used for data visualization and in engineering decision making. For example, a design of a yet-to-be-built physical system may be augmented based on the simulation results 106, or physical characteristics of an existing physical system may be augmented based on the simulation results 106 (e.g., a repair may be made in a physical system based on a simulated crack behavior simulation performed based on observed cracks in the physical system). In other instances, additional simulation servers and/or feedback among the simulation servers 104, 110, . . . may be utilized prior to generating final simulation results 106.

Because the data sets involved in the process of generating the simulation results 106 (e.g., the input geometry, each set of intermediate data from the simulation servers 104, 110, the simulation results 106) may be very large, the speed at which the simulation can be performed may be hampered by the ability to transfer data among the simulations servers 104, 110. Systems and methods as described herein provide one or more levels of compression to simulation (e.g., compressed intermediate data 112 as illustrated in FIG. 1) so as to promote faster data transmission speeds, memory storage savings, power savings, and other benefits.

Figure 2:
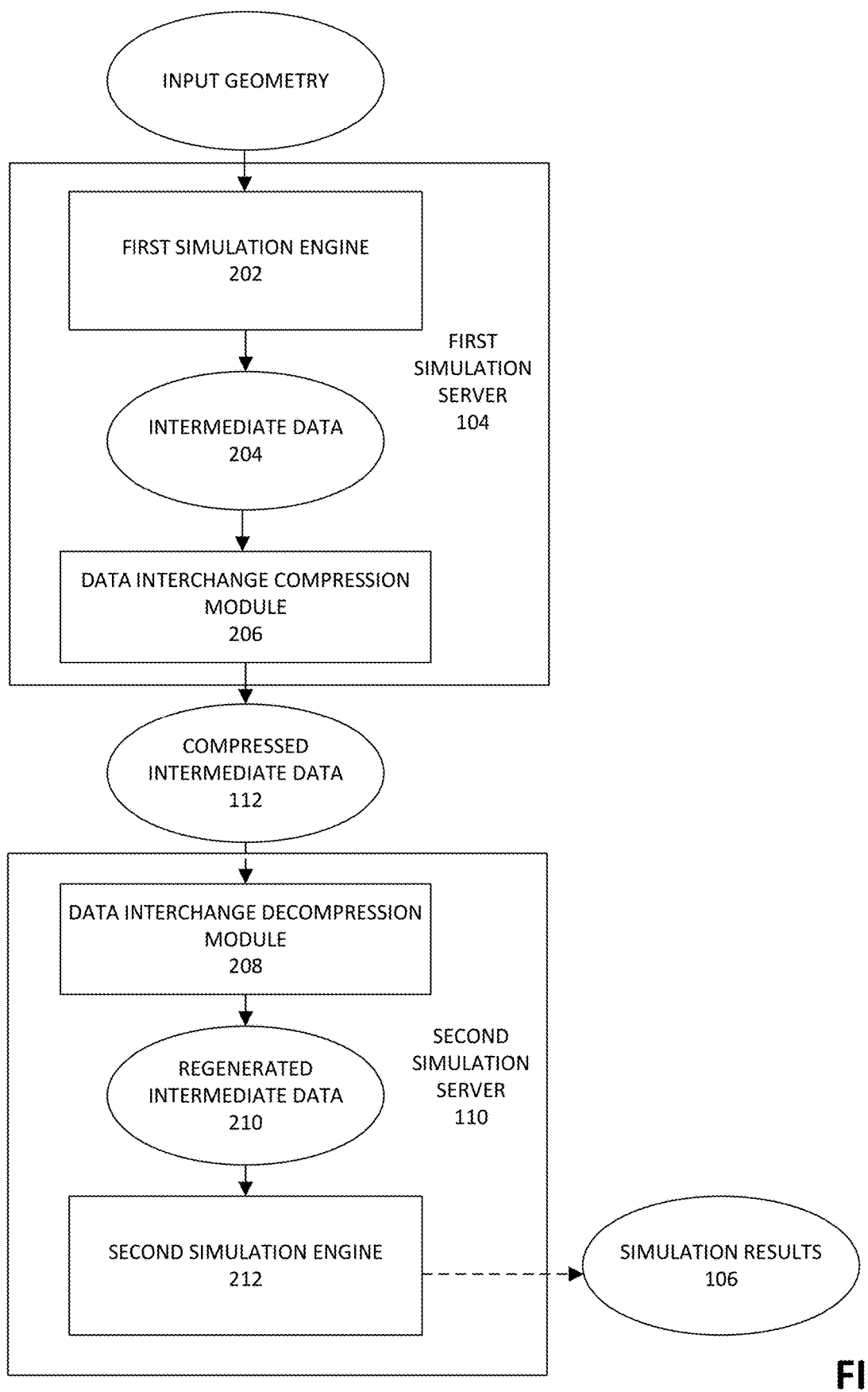
FIG. 2 is a diagram depicting a system for compressing and transmitting simulation data using data interchange compression/decompression modules.

FIG. 2 is a diagram depicting a system for compressing and transmitting simulation data using data interchange compression/decompression modules. Similar to FIG. 1, a system receives input geometry 102 that represents a physical system to be simulated at a first simulation server 104. The first simulation server 104 includes a first simulation engine 202 that performs a portion of the simulation operations as a step in providing simulation results 106. The first simulation engine 202 provides intermediate data 204 The simulation engine 202 may provide intermediate data 204 at the conclusion of its simulation operation or in a streaming data fashion. In instances where intermediate data 204 is provided in a streaming fashion, multiple simulation engines may be able to operate at the same time in parallel (e.g., in a pipelined fashion) providing a time savings over serial processing. The intermediate data 204 is provided to a data interchange compression module 206 that provides one or more layers of compression to the intermediate data 204 before that data is transmitted from the first simulation server 104 as compressed intermediate data 112, such as over one or more data networks.

The compressed intermediate data 112 may be transmitted to a variety of one or more destinations, including long term storage on the first simulation server 104, long term storage on another server (not shown), an/or, as shown in FIG. 2, to a second simulation server 110. At the second simulation server 110, the compressed intermediate data 112 may be retained in long term storage and/or provided for further simulation. When the compressed intermediate data 112 is to be used for further simulation, the compressed intermediate data 112 is accessed and is provided to a data interchange decompression module 208. In embodiments, the data interchange decompression module 208 includes functionality that operates substantially in reverse of data interchange compression module 206 to form regenerated intermediate data 210 that is identical to or similar to intermediate data 204. In embodiments, modules 206/208 are structured as data interchange compression/decompression modules, providing both compression and decompression services to their respective servers. Such an arrangement may facilitate the second simulation server 110 providing simulation operations before the first simulation server 104, allowing configuration (e.g., ordering) of servers and their respective simulation operations depending on the needs of a current simulation project. The data interchange decompression module 208 processes the compressed intermediate data 112 to generate regenerated intermediate data 210 that is provided to a second simulation engine 212. The second simulation engine 212 performs a simulation operation using the regenerated intermediate data 210. In some instances, the output of the second simulation engine 212 may be the final simulation results 106. In other instances, the second simulation engine's output may be further intermediate data that requires downstream processing before being the final simulation results 106. For example, output from the second simulation engine 212 may be second intermediate data that is compressed and transmitted to additional server(s) for further simulation operations.

Simulation data may take a wide variety of forms. Simulation data often represents physical characteristics of an object being simulated (e.g., a temperature, a pressure, a voltage, a mass) or an environment (e.g., a gas such as air, a liquid such as water) in which that object resides. As noted above, simulation data (e.g., intermediate results) is often represented as real number data, such as using float and double precision data structures. These data structures are large, where a float precision real number is stored using 4 bytes while a double precision real number is stored using 8 bytes. It has been discovered that simulation data may exhibit data locality, where the data may include portions that are of substantially similar magnitudes (e.g., with 0-4 orders of magnitude of one another). FIG. 3 is a diagram depicting a portion of an intermediate data set. The depicted simulation data is a set of floating point data values that characterize one or more simulated physical properties of a physical object being simulated. Specifically, the data of FIG. 3 represents an element nodal stress for an 8-node linear element determined via finite element analysis. Each element, represented by a row in FIG. 3, has three component values, one each for the X, Y, and Z direction. Thus the element nodal stress results of FIG. 3 have 8*3=24 floating point numbers, which serve as intermediate data 204 inputs to a data interchange compression module 206. It is noted that most (21 of 24) of the depicted data values are in the e-04 to e-06 order of magnitude range, while the other three data values are in the e-15 to e-16 order of magnitude range. Certain systems and methods as described herein are configured to cluster data values of similar order of magnitude into a group for compression. In embodiments, a first master data value is identified for a first group of data values, where the first master data value is retained in its real number (e.g., float, double precision). Other data values in the first group of data values are converted to integer representations (e.g., fractional representations relative to the first master data value), where those integer representations can be stored using smaller data structures (e.g., a varint data structure of 1-4 bytes in width depending on the size of the integer representation).

Figure 4:
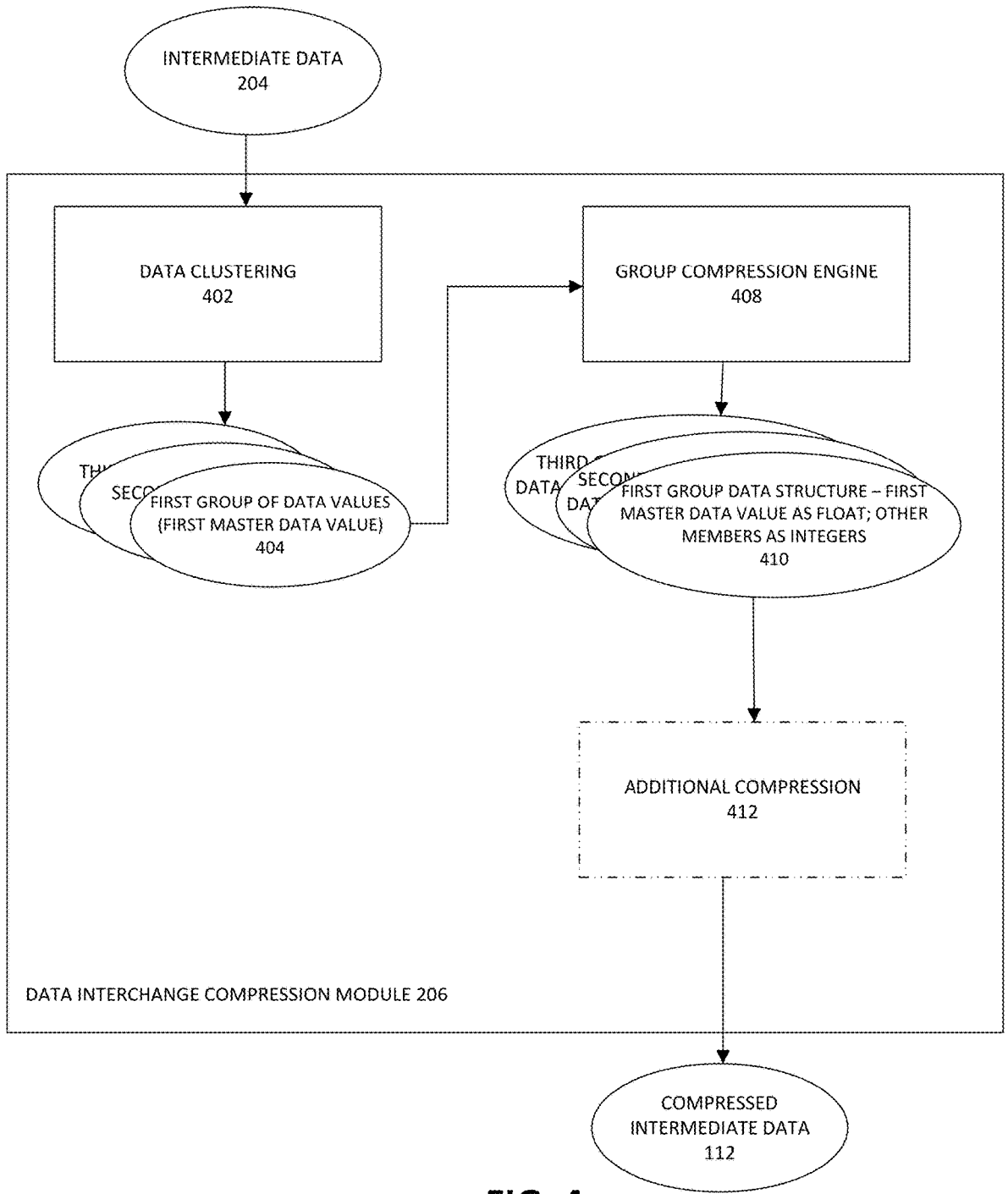
FIG. 4 is a diagram depicting an example data interchange compression module.

FIG. 4 is a diagram depicting an example data interchange compression module. A data interchange compression module 206 receives intermediate data 204 (e.g., a complete simulation data set, a portion of streaming simulation data). In an embodiment, the intermediate data 204 is simulation data that includes a set of floating point data values, where the simulation data characterizes simulated physical properties of a physical object. The intermediate data set is processed at 402 using a clustering algorithm to determine groups of data values within the received intermediate simulation data 204. In one embodiment, the clustering at 402 includes identifying a first master data value from the set of floating point data values, which, in certain examples, is the data value having a largest magnitude in the set of data being analyzed. The processing at 402 further clusters one or more data values, which may in some instances be consecutive, from the set of data values as a first group of data values based on a comparison between a data value of the set and the first master data value, thus forming a first group of data values 404 having a first master data value that is a member of that first group 404. A next data value subsequent to the first group 404 in the set is not clustered into the first group of data values according to a comparison between the next data value and the first master data value, where in embodiments, that next data value is assigned to a second group of data values. Other additional data values subsequent to the next data value are clustered with one of the first group of data values, the second group of data values, or a further group of data values based on comparisons with the respective master data values of those groups.

An example clustering can be illustrated with reference back to FIG. 3. As noted above, FIG. 3 depicts simulation data that includes a set of 24 floating point data values. In an embodiment, a first master data value (i.e., −1.3687e-04) for a first group of data values is selected from the set of 24 floating point data values as the floating point data value having the largest magnitude. The remaining floating point data values are compared to the first master data value to determine whether those remaining floating point data values should be included in the first group with the first master data value. In an embodiment, that comparison is performed based on a threshold, where remaining floating point data values that have a magnitude less than the threshold distance from the first master data value are clustered into the first group, while remaining floating point data values that have a magnitude more than the threshold distance from the first master data value are not included in the first group. In an embodiment, the threshold is determined based on the first master data value and the maximum size of an integer representation for the compression algorithm. In an embodiment where the real data values (e.g., as depicted in FIG. 3) are float data values that are 4 bytes wide, it would not be economical to use integers that are more than 4 bytes wide for integer representations. Thus, integer representations would be limited to no more than a maximum of 4 bytes (32 bits). The threshold is then set as the real number whose ratio relative to the first master data value can be represented in maximum integer size (e.g., 4 bytes). Remaining data values whose ratio could be represented via an integer of the maximum width or less are included in the first group (i.e., having a magnitude difference from the first data value of less than the threshold), where remaining data values whose ratio could not be represented via an integer of the maximum width or less are not included in the first group.

In the example of FIG. 3, all but three (−2.9643e-16; 4.1535e-16; 3.4385e-15) of the floating point data values are included in the first group. Subsequent clustering operations may be performed on the remaining data values (e.g., in a recursive fashion until a recursive stop criteria is reached) to identify further groups, such as until a maximum number of groups is reached or until all floating point data values are assigned to a group. In the example of FIG. 3, all of the noted floating point data values are clustered into the second group, where 3.4385e-15 is identified as the master data value for the second group based on its largest magnitude. The other two members of the second group of data values (−2.9643e-16; 4.1535e-16), being within a second threshold distance from that second master data value would thus be included in the second group.

Once the intermediate data values 204 are clustered into groups of data values 404 having one master data value identified per group, the groups are provided to a group compression engine 406. The group compression engine 408 is configured to convert members of each group, other than the master data value for the group, into integer representations. In embodiments, the integer representation is based on a ratio of the master data value and a particular data value being converted to an integer representation, as described further herein. In instances where that ratio is small, the integer representations can be stored in fewer bytes of data than are required for storage of the real number representation of the data value (e.g., in a 1-4 (or fewer such as 1-3) byte varint data structure compared to a 4 byte float data structure; a 1-8 (or fewer such as 1-7) byte varint data structure compared to an 8 byte double data structure). Each group of data values is compressed at 408 into a group data structure 410 having the master data value in a real number (e.g., float, double) representation and other group members in an integer representation. In embodiments, the group data structures may be further compressed via one or more additional techniques at 412 prior to being output from the data interchange compression module 206 as compressed intermediate data 112.

Figure 5:
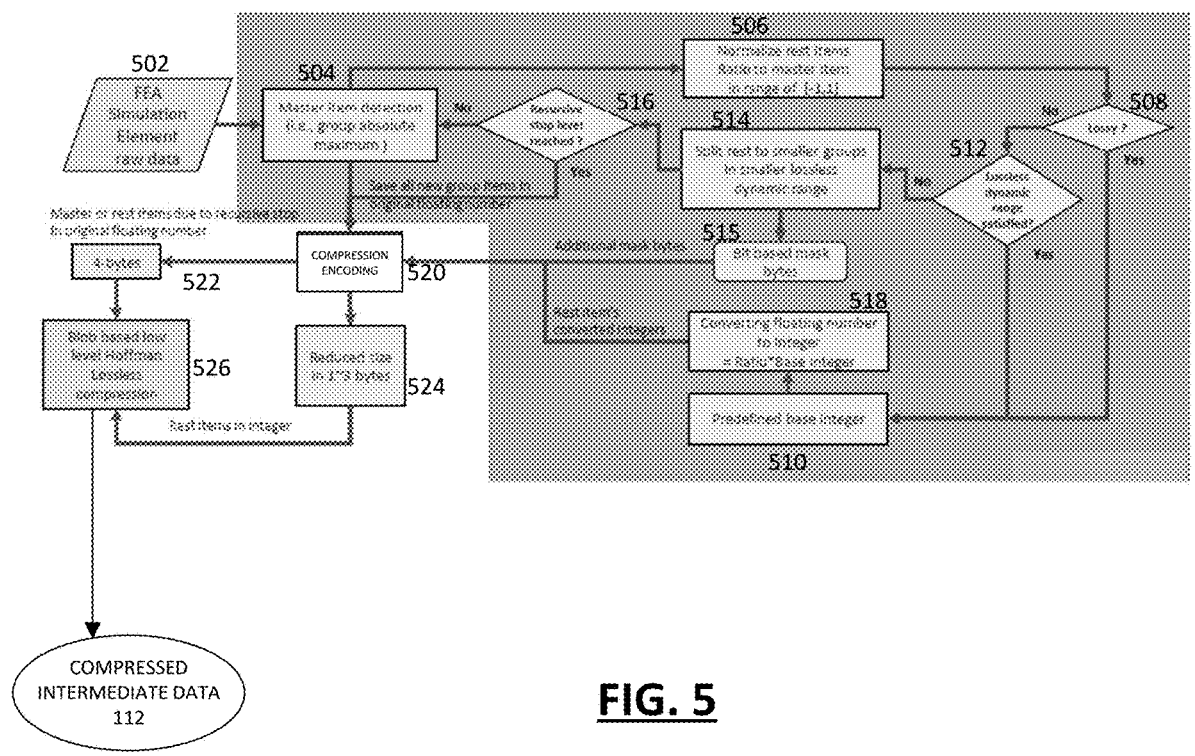
FIG. 5 is flow diagram depicting an example data interchange compression module algorithm.

FIG. 5 is flow diagram depicting an example data interchange compression module algorithm. In the algorithm, a set of floating point intermediate data in the form or Finite Element Analysis simulation element raw data (e.g., from a first simulation engine) is received. The maximum absolute value (magnitude) value from the set is identified at 504 as the first master data value. At 506, the other data values of the set 502 are normalized relative to the first master data value on a scale of −1 to 1 (e.g., normalized value=data value/first master data value). The process moves to step 508 at the start of a loop via which other normalized data values of the set 502 are considered to determine if additional groups are required. In some simulation scenarios, lossy compression may be permissible. That is, in some scenarios, it may be acceptable to have some loss in data fidelity between the intermediate data that is generated by a first simulation engine and the regenerated intermediate data that is provided to a second simulation engine. In those instances, it may be acceptable to perform compression of the set of floating point data values using only one group of data values. In that case where lossy compression is permissible, processing of the floating point data values proceeds immediately to integer conversion at 510. In one example, a system may require that some groups (e.g., a largest magnitude one or more groups, a group having the largest number of members) be processed using lossless compression, while other groups (e.g., groups having members with magnitudes orders of magnitude smaller than a first group's members) may be processed using lossy compression.

In instances where lossy compression is not adequate, the normalized data values are evaluated at 512 to see whether they can all be represented using up to the largest permissible integer size (e.g., 4 bytes when the floating point data values are 4 byte float data structures) based on a threshold comparison at 512. When all of the normalized data values can be represented without a loss of fidelity, that normalized data values are sent for integer conversion at 510. When the integer conversion of one or more of the normalized data values would saturate the maximum size integer range, an additional group (e.g., a second group) is formed at 514. When a new group is to be formed, bit-based mask bytes are provided at 515 to data packaging modules 520, 522, 524, 526 to indicate the presence of an additional group of data values in the compressed intermediate data 112 that is output from the data interchange compression algorithm. The bit-based mask data generated at 515 maps grouped and compressed data values in the compressed intermediate data 112 to their original position in the intermediate data (e.g., its row and column in the FIG. 3 data set) such that the compression process can be fully reversed to provide regenerated intermediate data 210 that is an exact match of the intermediate data 204 when lossless compression is applied. In instances where lossy compression is used, compressed intermediate data 112 may be transmitted using a single group without reordering, such that the bit based mask bytes are not necessary.

With further reference to FIG. 5, an evaluation is performed at 516 to determine whether a recursive stop criteria is reached (e.g., a maximum number of groups have already been formed, this current normalized data value is the last normalized data value such that it would be a group of one). When the stop criteria is reached at 516, the normalized data values that cannot be losslessly represented by relative to the master data value by the maximum integer size are output for transmission as floating point values (i.e., without any integer conversion). If the recursive stop criteria has not been reached at 516, then a new group is formed, where a master data item is selected for the new group at 514, and the process recursively proceeds to 506.

With reference back to 510, the normalized data values for the current group in the recursive process is converted to integer form at 518, where its integer form is selected according to:

Integer Form=Normalized Data Value(from 506)
\*Base Integer.

where the base integer is a preselected data values. In an embodiment where the maximum integer size is 4 bytes wide (e.g., where float data structures represent the intermediate data at 502) and where lossless compression is desired (e.g., see step 508), then the base integer is selected as $2^{23}$. In instances where lossy data compression is permitted, the base integer may be one of $2^7$, $2^{15}$, or $2^{23}$. The integer representations of the group's members (other than the master data item that remains in real number (e.g., float) data form) are provided to packaging modules 520, 522, 524, 526.

The packaging modules 520, 522, 524, 526 prepare data (e.g., master data values and other orphan data values that remain in float form, integer representations of data values assigned to groups) for output as compressed intermediate data 112. At 520, the data values are provided for compression encoding. Compression encoding enables storage of representations of certain of the floating (or other real number format such as double precision) point data values 502 in less memory space than is required in their floating point state. Master data values are retained in their floating point form (e.g., 4-bytes wide) as indicated at 522. Similarly, other data values that are not included in a group (e.g., because a recursive stop condition such as a maximum number of groups condition was reached at 516) are retained in their floating point form at 522. Integer representations of floating point values, as generated at 518, may be compressed at 520, such as by using a variable length data structure (e.g., a varint data structure). A varint data structure is configured to store an integer value using an adjustable number of bytes. A size of a varint data record is selected based on the magnitude of an integer being stored. For example, where an integer determined at 518 is between −128 and +128, the integer may be stored in a varint data structure using 1 byte, with one bit being dedicated to the sign and seven bits being dedicated to the magnitude. Similarly a 2 byte varint data structure can store integers ranging from −32,768 to +32,768. The compression encoding at 520 evaluates integer representations from 518 and packages those integer representations into varint data structures of a smallest possible size. If an integer representation can be stored in less than 4 bytes, then its size is reduced to 1-3 bytes, as indicated at 524. In embodiments where integer representations are permitted to be as wide as the floating point representations (e.g., 4 bytes), then the compression encoding 520 may package those integer representations using 4 bytes. In an embodiment, compression encoding at 520 is performed using a protobuf algorithm utilizing varint data structures. At 526, the compression encoded floating point representation of the master data value and integer representations of other data values of each group are packaged and, in embodiments, processed via additional levels of data compression. In the example of FIG. 5, that compression encoded data 522, 524 is further processed by a blob-based low level Hoffman Lossless compression algorithm at 526 before transmission from the data interchange compression module as compressed intermediate data 112.

Figure 6:
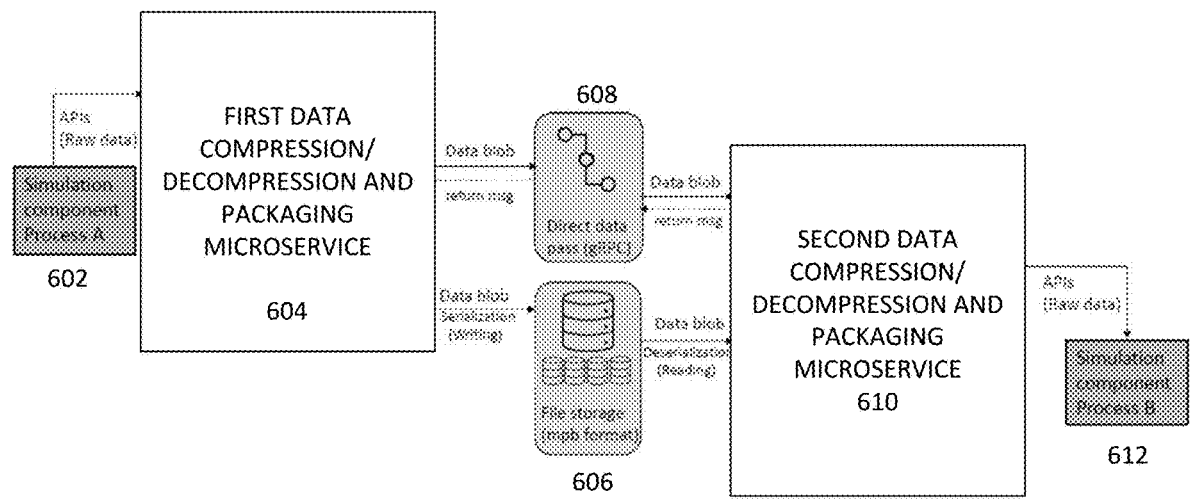
FIG. 6 is a diagram depicting data compression/decompression and packaging being provided as a microservice in a distributed network environment.

As described above, in embodiments, intermediate data from one simulation engine may be compressed and transmitted for use by other simulation engines. FIG. 6 is a diagram depicting data compression/decompression and packaging being provided as a microservice in a distributed network environment. In this example, a first simulation engine 602 provides intermediate data (raw data) via its API to a first data compression/decompression and packaging microservice 604. That microservice 604 may be located on a same computing resource (e.g., server) as the first simulation engine 602, on a same computing network as the first simulation engine 602, or in a disparate computing environment connected via a network. The microservice 604 processes the intermediate data from the first simulation engine 602, including compressing that data, to generate compressed intermediate data. That compressed intermediate data may be output in a variety of forms, such as the protobuf blob data structure form depicted in FIG. 6. The compressed intermediate data data structure may be transmitted to a data store, as depicted at 606, for long term storage. The compressed intermediate data may also, or in the alternative, be transmitted over a network 608 (e.g., from one cloud-based resource to another) to a second data compression/decompression and packaging microservice 610. In the example of FIG. 6 that second microservice 610 is associated with a second simulation engine 612. The second microservice 610 processes the compressed intermediate data received from 606 and/or 608 and applies one or more levels of decompression to reverse the compression process performed at the first microservice 604. The second data compression/decompression and packaging microservice 610 provides the second simulation engine 612 regenerated intermediate data via an API of that second simulation engine 612.

Figure 7:
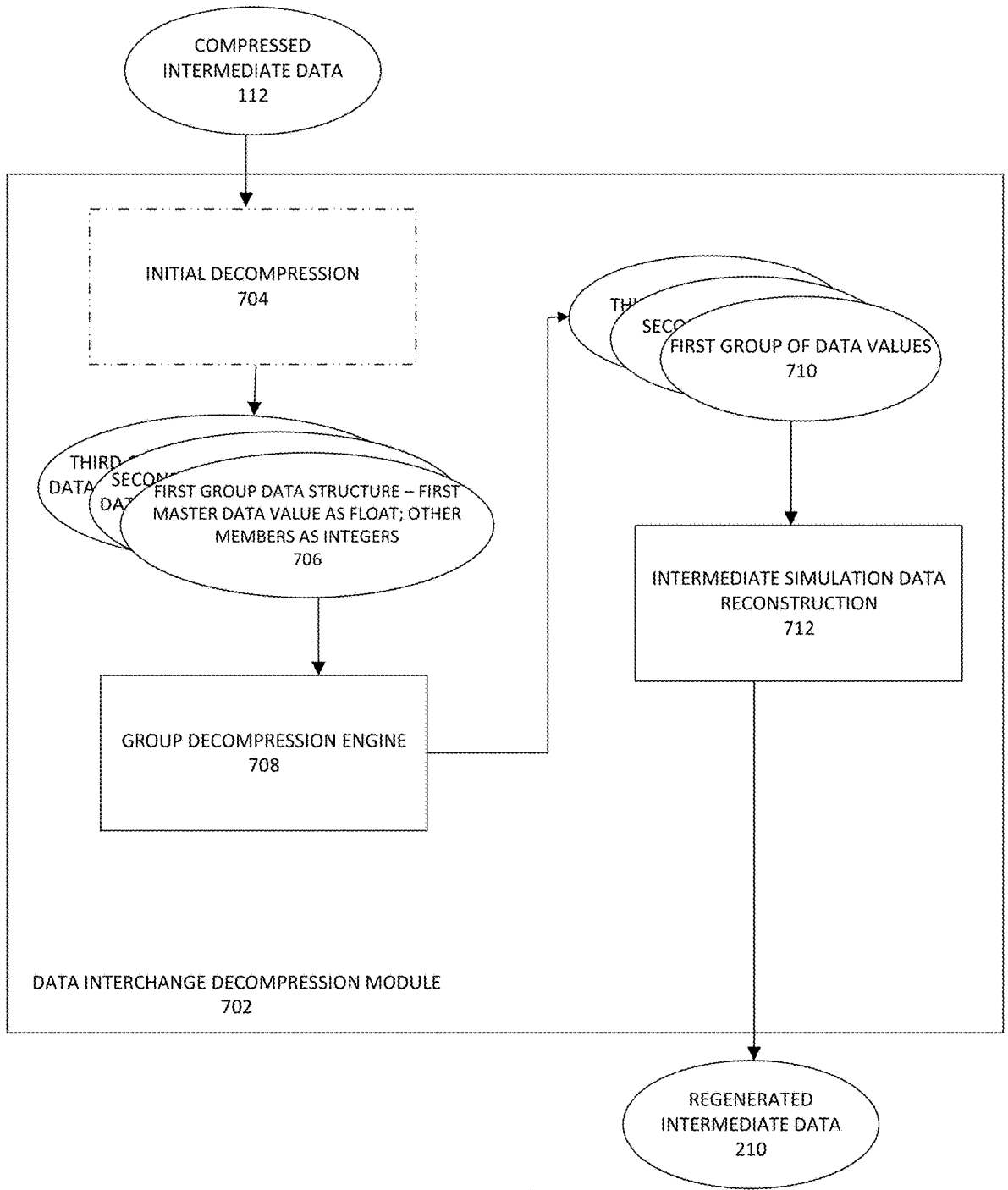
FIG. 7 is a diagram depicting example processing of a data interchange decompression module.

In an example, a data compression/decompression microservice may include a data interchange decompression module for reversing the compression performed at another microservice. FIG. 7 is a diagram depicting example processing of a data interchange decompression module. A decompression module 702 receives compressed intermediate data 112. At 704, initial decompression and unpacking are performed. The processing at 704 may reverse any additional layers of compression, such as the Hoffman compression at FIG. 5, and parse the remaining data into group data structures 706. Group data structures 706 include a first master data value in real number (e.g., float) form with other members being in integer form. A decompression engine 708 processes the group data structures 706 to convert the integer representations to groups of real number representations 710. In an example, that conversion includes converting integer representations to a normalized data value and then multiplying the normalized data value by the master data value for the group. Additional processing may be performed at 712 so as to return the data to the form (or near to the form) of the intermediate data produced by the prior simulation engine for output from the decompression module 702 as regenerated intermediate data 210 for further processing (e.g., by a next simulation engine).

Figure 8:
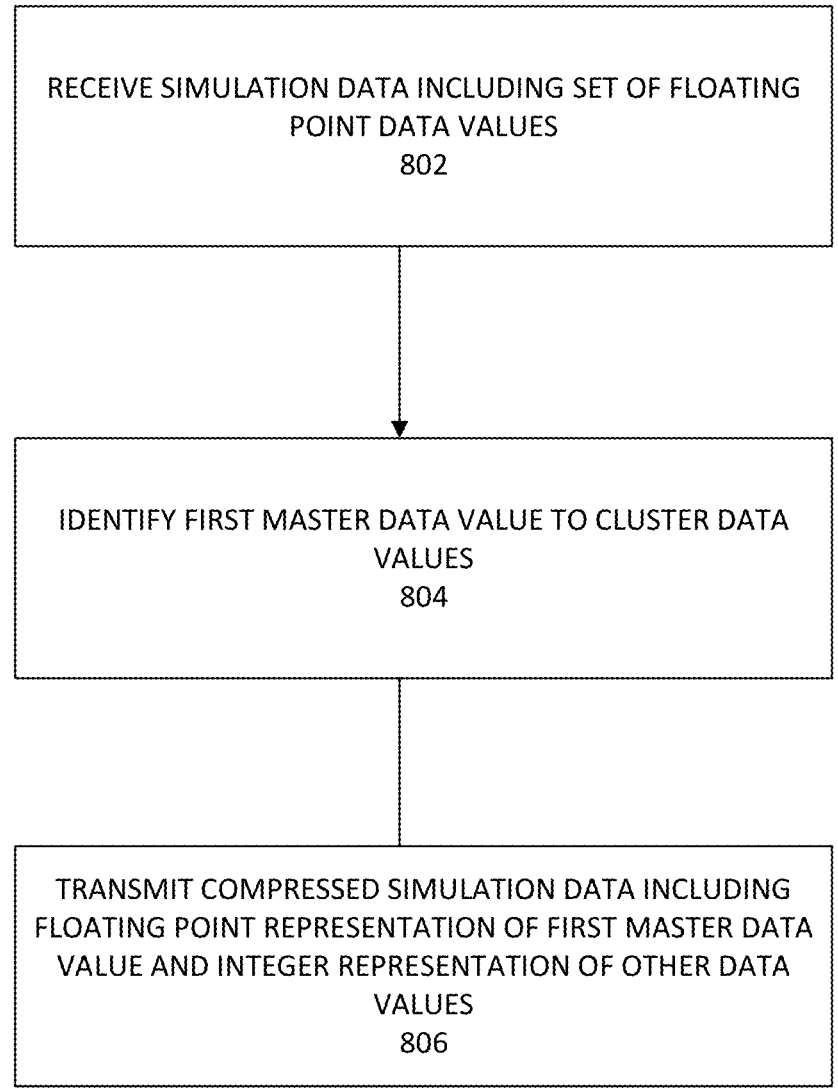
FIG. 8 is a flow diagram depicting example steps of a computer-implemented method for compressing and transmitting simulation data.

FIG. 8 is a flow diagram depicting example steps of a computer-implemented method for compressing and transmitting simulation data. The simulation data including a set of floating point data values is received at 802, the simulation data characterizing simulated physical properties of a physical object. A first master data value is identified at 804 from the set to cluster one or more data values from the set as a first group of data values based on a comparison between a data value of the set and the first master data value. Compressed simulation data is transmitted at 806, where the compressed simulation data includes a floating point representation of the first master data value and integer representations of other data values of the first group of data values.

Figure 9A:
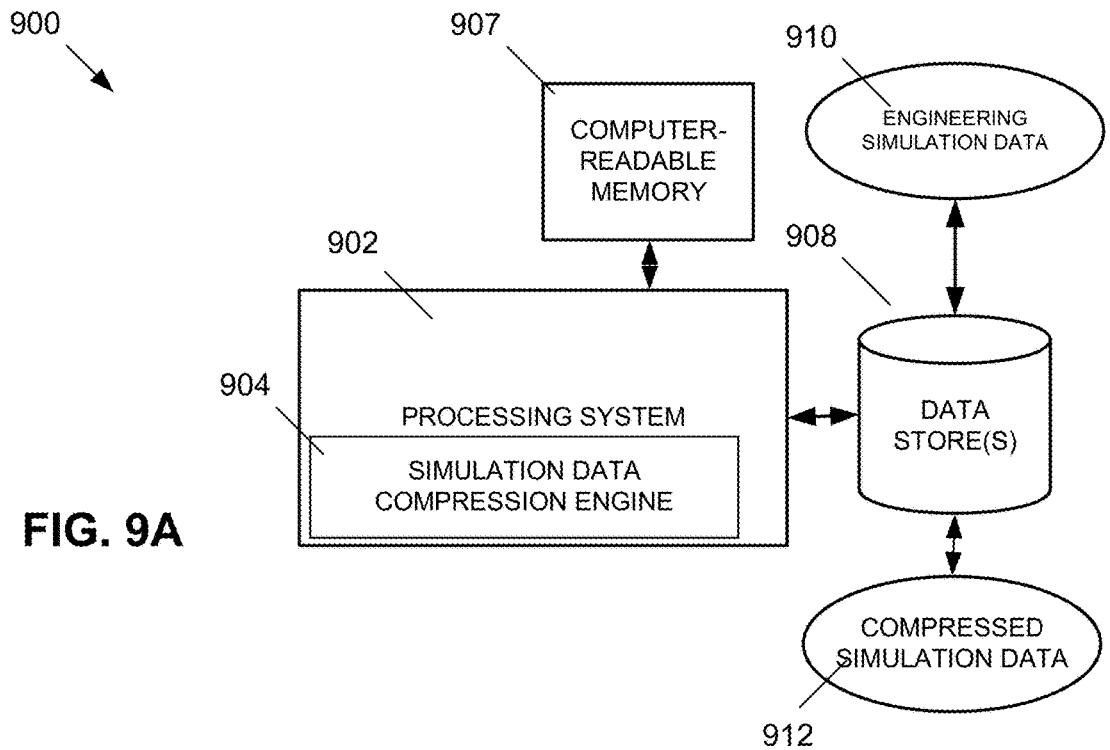
FIGS. 9A, 9B, and 9C depict example systems for implementing the approaches described herein for compressing and transmitting simulation data.
Figure 9B:
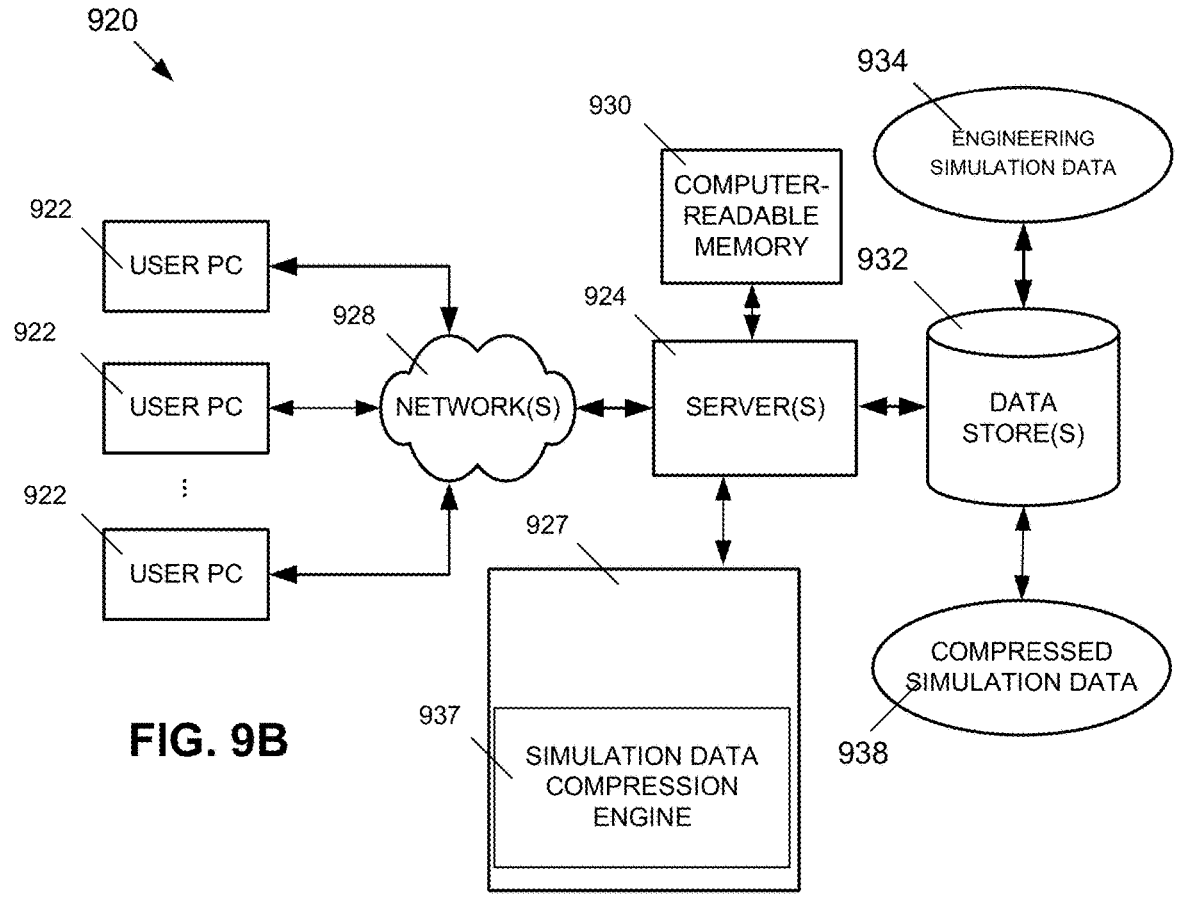
Figure 9C:
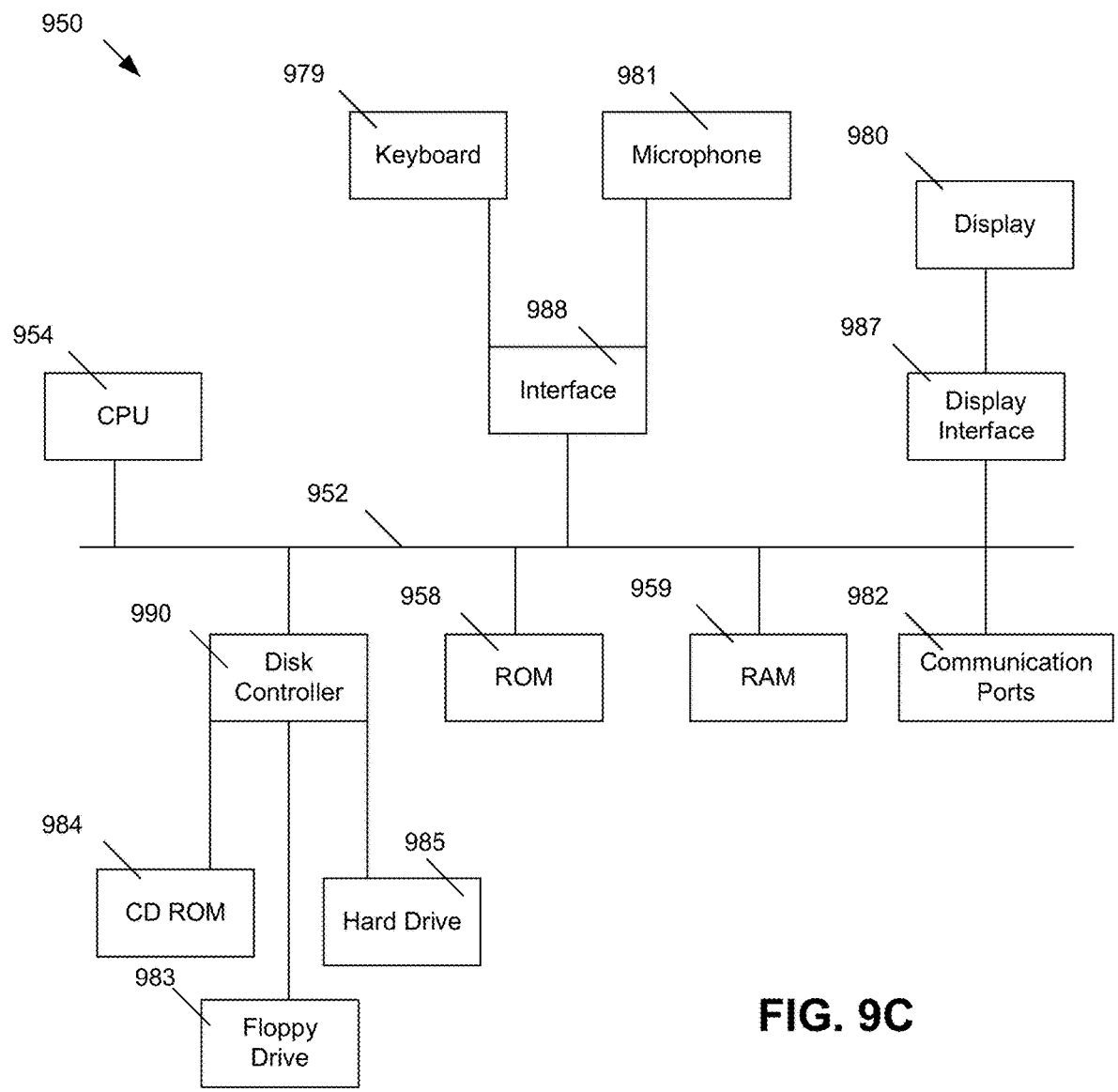

FIGS. 9A, 9B, and 9C depict example systems for implementing the approaches described herein for compressing and transmitting simulation data. For example, FIG. 9A depicts an exemplary system 900 that includes a standalone computer architecture where a processing system 902 (e.g., one or more computer processors located in a given computer or in multiple computers that may be separate and distinct from one another) includes a computer-implemented simulation data compression engine 904 being executed on the processing system 902. The processing system 902 has access to a computer-readable memory 907 in addition to one or more data stores 908. The one or more data stores 908 may include engineering simulation data 910 as well compressed simulation data 912. The processing system 902 may be a distributed parallel computing environment, which may be used to handle very large-scale data sets.

FIG. 9B depicts a system 920 that includes a client-server architecture. One or more user PCs 922 access one or more servers 924 a computer-implemented simulation data compression engine 937 on a processing system 927 via one or more networks 928. The one or more servers 924 may access a computer-readable memory 930 as well as one or more data stores 932. The one or more data stores 932 may include engineering simulation data 934 as well as compressed simulation data 938.

FIG. 9C shows a block diagram of exemplary hardware for a standalone computer architecture 950, such as the architecture depicted in FIG. 9A that may be used to include and/or implement the program instructions of system embodiments of the present disclosure. A bus 952 may serve as the information highway interconnecting the other illustrated components of the hardware. A processing system 954 labeled CPU (central processing unit) (e.g., one or more computer processors at a given computer or at multiple computers), may perform calculations and logic operations required to execute a program. A non-transitory processor-readable storage medium, such as read only memory (ROM) 958 and random access memory (RAM) 959, may be in communication with the processing system 954 and may include one or more programming instructions for providing compression and transmission of simulation data. Optionally, program instructions may be stored on a non-transitory computer-readable storage medium such as a magnetic disk, optical disk, recordable memory device, flash memory, or other physical storage medium.

In FIGS. 9A, 9B, and 9C, computer readable memories 907, 930, 958, 959 or data stores 908, 932, 983, 984, 988 may include one or more data structures for storing and associating various data used in the example systems. For example, a data structure stored in any of the aforementioned locations may be used to store data from XML files, initial parameters, and/or data for other variables described herein. A disk controller 990 interfaces one or more optional disk drives to the system bus 952. These disk drives may be external or internal floppy disk drives such as 983, external or internal CD-ROM, CD-R, CD-RW or DVD drives such as 984, or external or internal hard drives 985. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 990, the ROM 958 and/or the RAM 959. The processor 954 may access one or more components as required.

A display interface 987 may permit information from the bus 952 to be displayed on a display 980 in audio, graphic, or alphanumeric format. Communication with external devices may optionally occur using various communication ports 982.

In addition to these computer-type components, the hardware may also include data input devices, such as a keyboard 979, or other input device 981, such as a microphone, remote control, pointer, mouse and/or joystick.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

It is claimed:

1. A system for compressing and transmitting simulation data, comprising:
    a memory storing executable instructions; and
    one or more data processors coupled to the memory, the one or more data processors execute the executable instructions to:
        receive the simulation data including a set of floating point data values, the simulation data characterizing simulated physical properties of a physical object;
        generate a cluster from the set of floating data values having a first master data value and a plurality of other floating point data values, the cluster forming a first group of data values and is based on a comparison between a data value of the set and the first master data value;
        generate, for each of the other data values of the first group of data values, an integer representation based on a ratio between the first master data value and such other floating point data value; and
        transmit compressed simulation data comprising a floating point representation of the first master data value and the integer representations of the other data values of the first group of data values.

2. The system of claim 1, wherein the data value of the set is assigned to a second group of data values, wherein one or more additional data values subsequent to the data value of the set are clustered with the second group of data values.

3. The system of claim 2, wherein one or more further data values subsequent to the data value of the set are clustered with the first group of data values.

4. The system of claim 1, wherein said comparison between the data value of the set and the first master data value is based on a threshold.

5. The system of claim 4, wherein the threshold is based on the first master data value and a number of bits available for storing the integer representation.

6. The system of claim 1, wherein:
    the simulation data is generated on a first simulation server;
    the transmitted compressed simulation data is received by a second simulation server;
    the compressed simulation data is decompressed by the second simulation server to result in decompressed simulation data; and
    final simulation results are generated by the second simulation server using the decompressed simulation data.

7. The system of claim 1, wherein the first master data value is selected from the set based on the first master data value having the largest magnitude.

8. The system of claim 1, wherein the processors are configured to execute the executable instructions to further:
    identify a second master data value from data values that are not assigned to the first group.

9. The system of claim 8, wherein the second master data value is selected as the data value not clustered in the first group that has the largest magnitude.

10. The system of claim 1, wherein the executable instructions are configured to command the one or more data processors to utilize recursion to determine additional groups until a recursive stop criteria is reached.

11. The system of claim 10, wherein the recursive stop criteria is reached when: a maximum number of groups is reached or all data values of the set are assigned to a group.

12. The system of claim 1, wherein the compressed simulation data is transmitted to a decompression service operating on one or more data processors, the decompression service being associated with an operating simulation module.

13. The system of claim 12, wherein the compressed simulation data is further transmitted to a non-transitory computer-readable medium for storage.

14. The system of claim 1, wherein the compressed simulation data comprises a data structure that stores integer representations as a varint data type.

15. The system of claim 14, wherein a number of bytes for storage of the integer representation of a particular other data value of the first group is selected based on a magnitude of the integer representation of the particular other data value.

16. The system of claim 1, wherein the simulation data is output from a first simulation engine that provides a first type of physics simulation;
wherein the compressed simulation data is transmitted to a second simulation engine that provides a second type of physics simulation using the compressed simulation data to provide output data.

17. A processor-implemented method comprising:
receiving the simulation data including a set of floating point data values, the simulation data characterizing simulated physical properties of a physical object;
generating a cluster from the set of floating data values having a first master data value and a plurality of other floating point data values, the cluster forming a first group of data values and is based on a comparison between a data value of the set and the first master data value;
generating, for each of the other data values of the first group of data values, an integer representation based on a ratio between the first master data value and such other floating point data value; and
transmitting compressed simulation data comprising a floating point representation of the first master data value and the integer representations of the other data values of the first group of data values.

18. The method of claim 17, wherein said comparison between the data value and the first master data value is based on a threshold.

19. The method of claim 18, wherein the threshold is based on the first master data value and a number of bits available for storing the integer representation.

20. The method of claim 17, further comprising:
generating the simulation data on a first simulation server;
receiving the transmitted compressed simulation data by a second simulation server;
decompressing the compressed simulation data by the second simulation server to result in decompressed simulation data; and
generating, using the decompressed simulation data and by the second simulation server, final simulation results.

21. A non-transitory computer-readable medium encoded with instructions for commanding one or more data processors to execute operations comprising:
receiving simulation data including a set of floating point data values, the simulation data characterizing simulated physical properties of a physical object;
generating a cluster from the set of floating data values having a first master data value and a plurality of other floating point data values, the cluster forming a first group of data values and is based on a comparison between a data value of the set and the first master data value;
generating, for each of the other data values of the first group of data values, an integer representation based on a ratio between the first master data value and such other floating point data value; and
transmitting compressed simulation data comprising a floating point representation of the first master data value and the integer representations of the other data values of the first group of data values.

* * * * *